(12) United States Patent
Dgani et al.

(10) Patent No.: US 10,686,451 B2
(45) Date of Patent: Jun. 16, 2020

(54) DPLL WITH ADJUSTABLE DELAY IN INTEGER OPERATION MODE

(71) Applicant: Intel IP Corporation, Santa Clara, CA (US)

(72) Inventors: Yair Dgani, Raanana (IL); Michael Kerner, Tel Mond (IL); Elan Banin, Raanana (IL); Nati Dinur, Haifa (IL); Gil Horovitz, Emek-Hefer (IL); Rotem Banin, Pardes-Hana (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/465,515

(22) PCT Filed: Dec. 30, 2016

(86) PCT No.: PCT/US2016/069584
§ 371 (c)(1),
(2) Date: May 30, 2019

(87) PCT Pub. No.: WO2018/125232
PCT Pub. Date: Jul. 5, 2018

(65) Prior Publication Data
US 2020/0067513 A1 Feb. 27, 2020

(51) Int. Cl.
*H03L 7/081* (2006.01)
*H04L 7/033* (2006.01)
(Continued)

(52) U.S. Cl.
CPC .............. *H03L 7/081* (2013.01); *H03L 7/093* (2013.01); *H03L 7/099* (2013.01); *H04L 7/0331* (2013.01)

(58) Field of Classification Search
CPC ......... H03L 7/081; H03L 7/093; H03L 7/099; H04L 7/0331
See application file for complete search history.

(56) References Cited

U.S. PATENT DOCUMENTS

| 2003/0184393 A1 | 10/2003 | Haroun et al. |
| 2008/0012647 A1* | 1/2008 | Risbo ...................... H03L 7/093 331/16 |

(Continued)

FOREIGN PATENT DOCUMENTS

JP 2013077868 A 4/2013

OTHER PUBLICATIONS

"International Application Serial No. PCT/US2016/069584, International Search Report dated Sep. 22, 2017", 3 pgs.
(Continued)

*Primary Examiner* — Freshteh N Aghdam
(74) *Attorney, Agent, or Firm* — Kowert, Hood, Munyon, Rankin & Goetzel, P.C.

(57) ABSTRACT

Aspects of a digital phase-lock loop (DPLL) with an adjustable delay between an output clock and a reference clock in accordance with phase noise compensation are generally described herein. An apparatus may include processing circuitry configured to, in a first mode, identify a delay element of a plurality of delay elements based on an associated delay value, and set an initial phase difference value to a phase difference value associated with the identified delay element. The processor circuitry may be further configured to, in a second mode, in a second mode, initialize the DPLL using the initial phase difference value, determine a phase error between a reference clock and a feedback clock based on the initial phase difference value, adjust an output clock signal based on the phase error.

24 Claims, 5 Drawing Sheets

(51) Int. Cl.
H03L 7/099 (2006.01)
H03L 7/093 (2006.01)

(56) References Cited

U.S. PATENT DOCUMENTS

| | | | |
|---|---|---|---|
| 2009/0262878 A1 | 10/2009 | Sun et al. | |
| 2010/0260242 A1* | 10/2010 | Abe | H03K 5/13 |
| | | | 375/219 |
| 2016/0056827 A1* | 2/2016 | Vlachogiannakis | |
| | | | H03B 5/1265 |
| | | | 327/158 |
| 2016/0094232 A1 | 3/2016 | Ainspan et al. | |
| 2017/0201259 A1* | 7/2017 | Lee | H03L 7/0991 |

OTHER PUBLICATIONS

"International Application Serial No. PCT/US2016/069584, Written Opinion dated Sep. 22, 2017", 9 pgs.

* cited by examiner

DPLL WITH ADJUSTABLE DELAY IN INTEGER OPERATION MODE

This application is a U.S. National Stage filing under 35 U.S.C. 371 from International Application No. PCT/US2016/069584, filed Dec. 30, 2016 and published in English as WO 2018/125232 on Jul. 5, 2018, which is incorporated herein by reference in its entirety.

TECHNICAL FIELD

Aspects pertain to wireless networks. Some aspects of the disclosure relate to wireless local area networks (WLANs) and Wi-Fi networks including networks operating in accordance with the IEEE 802.11 family of standards. Some aspects of the disclosure relate to millimeter wave (mmWave) communication, including mmWave communication in accordance with IEEE 802.11ad, IEEE 802.11ay and/or Fifth Generation (5G) networks as well as LTE and LTE-A family of standards.

BACKGROUND

Mobile devices may communicate with a base station of a mobile network to exchange data, voice and other information. As clock speeds continue to increase, ensuring synchronization may become more challenging for efficient reception of data. Some digital synchronization circuits may use delay elements to synchronize clocks, but those delay elements may have inconsistent step sizes due to process and temperature variance, which results in jitter. Jitter on the signal causes phase noise, which may distort a signal and affect throughput.

DETAILED DESCRIPTION

The following description and the drawings sufficiently illustrate specific aspects of the disclosure to enable those skilled in the art to practice them. Other aspects of the disclosure may incorporate structural, logical, electrical, process, and other changes. Portions and features of some aspects of the disclosure may be included in, or substituted for, those of other aspects of the disclosure. Aspects set forth in the claims encompass all available equivalents of those claims.

Figure 1:
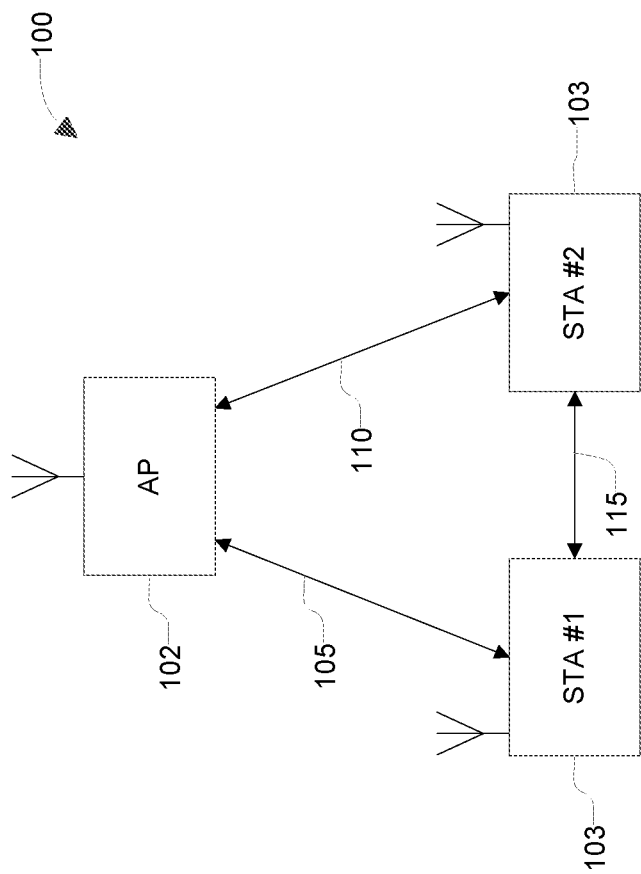
FIG. 1 illustrates a wireless network in accordance with some aspects of the disclosure.

FIG. 1 illustrates a wireless network in accordance with some aspects of the disclosure. In some aspects of the disclosure, the network 100 may be a Wireless Local Area Network (WLAN) or a Wi-Fi network, although the scope of aspects of the disclosure is not limited in this respect. It should be noted that aspects of the disclosure are not limited to the number or type of components shown in the example network 100. Aspects are also not limited by the example network 100 in terms of the arrangement of the components or the connectivity between components as shown. In addition, some aspects of the disclosure may include additional components.

The example network 100 may include one or more access points (APs) 102 and one or more stations (STAs) 103. In some aspects of the disclosure, the AP 102 may be arranged to operate in accordance with one or more IEEE 802.11 standards. These aspects of the disclosure are not limiting, however, as other base station components, which may or may not be arranged to operate in accordance with a standard, may be used in some aspects of the disclosure. As an example, an Evolved Node-B (eNB) arranged to operate in accordance with one or more Third Generation Partnership Project (3GPP) standards, including but not limited to 3GPP Long Term Evolution (LTE) standards, may be used in some cases. In some aspects of the disclosure, the STAs 103 may be arranged to operate in accordance with one or more IEEE 802.11 standards. These aspects of the disclosure are not limiting, however, as other mobile devices, portable devices and/or other devices, which may or may not be arranged to operate in accordance with a standard, may be used in some aspects of the disclosure. As an example, a User Equipment (UE) arranged to operate in accordance with one or more Third Generation Partnership Project (3GPP) standards, including but not limited to 3GPP LTE standards, may be used in some cases.

In some aspects of the disclosure, the STAs 103 may be configured to communicate with the AP 102 and/or with other STAs 103. As shown in the example network 100 in FIG. 1, STA #1 may communicate with the AP 102 over the wireless link 105 and STA #2 may communicate with the AP 102 over the wireless link 110. In some aspects of the disclosure, direct communication between STAs 103 may be possible, such as over the wireless link 115 between STA #1 and STA #2. These aspects of the disclosure are not limiting, however, as the direction communication between STAs 103 may not necessarily be possible in some aspects of the disclosure.

In some aspects of the disclosure, the communication between the AP 102 and the STAs 103 and/or the communication between the STAs 103 may be performed in accordance with one or more standards, such as an 802.11 standard (including legacy 802.11 standards), a 3GPP standard (including 3GPP LTE standards) and/or other standards. These aspects of the disclosure are not limiting, however, as other communication techniques and/or protocols, which may or may be included in a standard, may be used for the communication between the AP 102 and the STAs 103 and/or the communication between the STAs 103, in some aspects of the disclosure.

In accordance with some aspects of the disclosure, the AP 102 may transmit one or more downlink frames to the STA 103 in accordance with a downlink frame format. These aspects of the disclosure will be described in more detail below.

It should be noted that the STAs 103, the AP 102, mobile devices, base stations and/or other devices may be configured to operate in various frequency bands, including but not limited to millimeter wave (mmWave), ultra high frequency (UHF), microwave and/or other frequency bands. In some cases, phase noise levels of receiver components, such as oscillators and phase-lock loops (PLLs) and/or others, may affect receiver performance. Such phase noise levels may be significantly higher, in some cases, for operation in mmWave frequency bands in comparison to operation in other frequency bands. For instance, traditional wireless systems may operate in the UHF and microwave frequency bands, in some cases. Accordingly, techniques and/or operations that address receiver phase noise may be more challenging for systems operating in the mmWave frequency bands.

In some aspects of the disclosure, the STAs 103, AP 102, other mobile devices, other base stations and/or other devices may be configured to perform operations related to contention based communication. As an example, the communication between the STAs 103 and/or AP 102 and/or the communication between the STAs 103 may be performed in accordance with contention based techniques. In such cases, the STAs 103 and/or AP 102 may be arranged to contend for a wireless medium (e.g., during a contention period) to receive exclusive control of the medium for a transmission period. For instance, the transmission period may include a transmission opportunity (TXOP), which may be included in an 802.11 standard and/or other standard.

It should be noted that aspects of the disclosure are not limited to usage of contention based techniques, however, as some communication (such as that between mobile devices and/or communication between a mobile device and a base station) may be performed in accordance with schedule based techniques. Some aspects of the disclosure may include a combination of contention based techniques and schedule based techniques.

In some aspects of the disclosure, the communication between mobile devices and/or between a mobile device and a base station may be performed in accordance with single carrier techniques. As an example, a protocol data unit (PDU) and/or other data frame may be modulated on a single carrier frequency in accordance with a single carrier modulation (SCM) technique.

In some aspects of the disclosure, the communication between mobile devices and/or between a mobile device and a base station may be performed in accordance with any suitable multiple-access techniques and/or multiplexing techniques. Accordingly, one or more of orthogonal frequency division multiple access (OFDMA), orthogonal frequency division multiplexing (OFDM), code-division multiple access (CDMA), time-division multiple access (TDMA), frequency division multiplexing (FDMA), space-division multiple access (SDMA), multiple-input multiple-output (MIMO), multi-user (MU) multiple-input multiple-output (MIMO) (MU-MIMO) and/or other techniques may be employed in some aspects of the disclosure.

In some aspects of the disclosure, channels used for communication between STAs 103 and/or APs 102 may be 2.16 GHz, 4.32 GHz, 6.48 GHz, 8.72 GHz and/or other suitable value. In some aspects of the disclosure, channels used for communication between STAs 103 and/or APs 102 may be configurable to use one of 20 MHz, 40 MHz, or 80 MHz contiguous bandwidths or an 80+80 MHz (160 MHz) non-contiguous bandwidth. In some aspects of the disclosure, a 320 MHz channel width may be used. In some aspects of the disclosure, subchannel bandwidths less than 20 MHz may also be used. In these aspects of the disclosure, each channel or subchannel may be configured for transmitting a number of spatial streams, in some aspects of the disclosure. The values given above may be part of an 802.11 standard, in some cases, although aspects of the disclosure are not limited as such. For instance, a 2.16 GHz channel may be used in accordance with an 802.11ad standard, and any of 2.16, 4.32, 6.48 or 8.72 GHz may be used in accordance with a channel bonding technique of an 802.11ay standard. These aspects of the disclosure are not limiting, however, as other suitable bandwidths may be used in some aspects of the disclosure. In addition, aspects of the disclosure are not limited to channel types or channel sizes that are included in a standard.

As used herein, the term "circuitry" may refer to, be part of, or include an Application Specific Integrated Circuit (ASIC), an electronic circuit, shared,) a processor dedicated, or group), and/or memory (shared, dedicated, or group) that execute one or more software or firmware programs, a combinational logic circuit, and/or other suitable hardware components that provide the described functionality the circuitry may be, aspects of the disclosure In some implemented in, or functions associated with the circuitry may be implemented by, one or more software or firmware modules. In some aspects of the disclosure, circuitry may include logic, at least partially operable in hardware. Aspects described herein may be implemented into a system using any suitably configured hardware and/or software.

Figure 2:
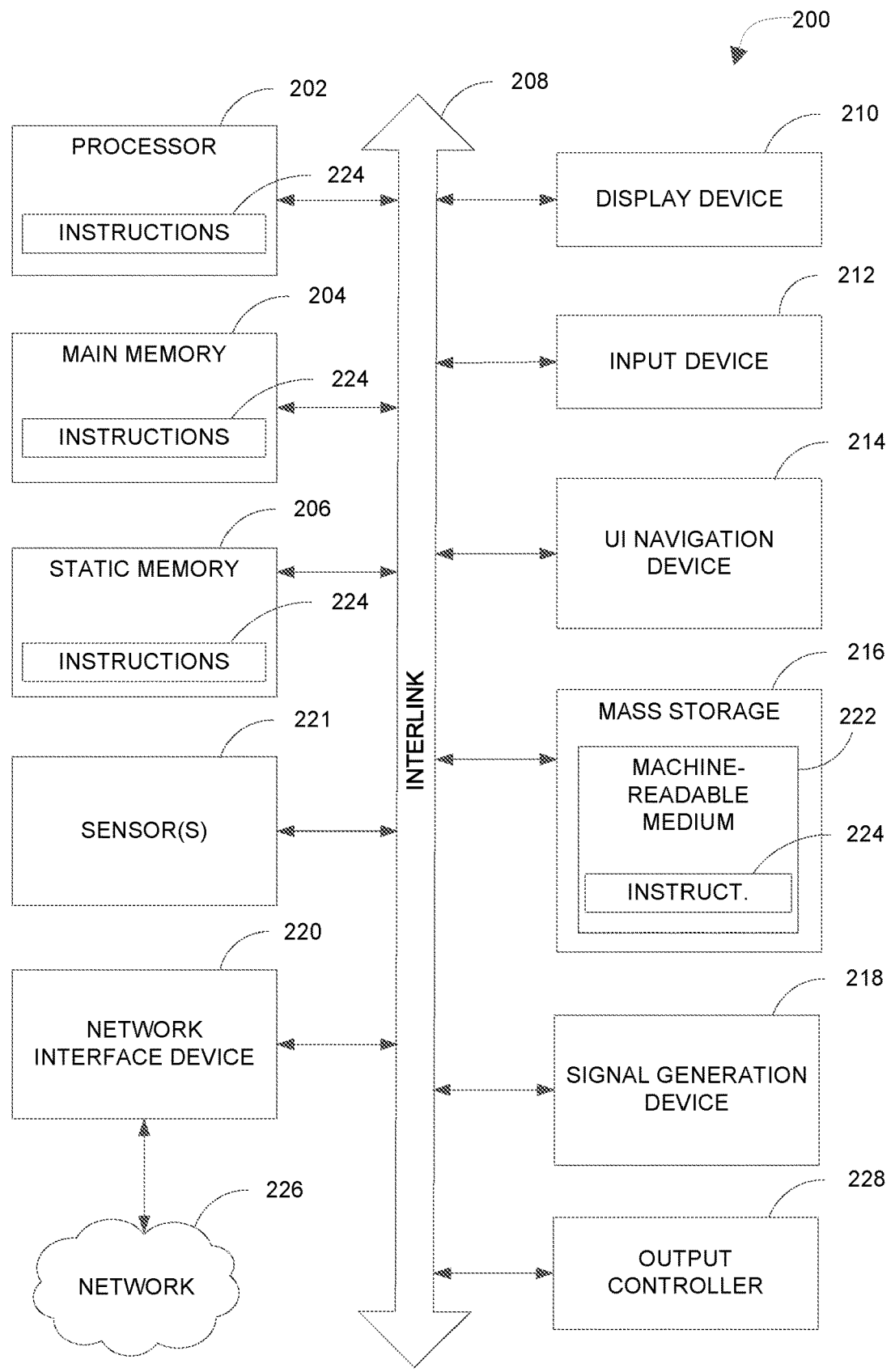
FIG. 2 illustrates an example machine in accordance with some aspects of the disclosure.

FIG. 2 illustrates a block diagram of an example machine in accordance with some aspects of the disclosure. The machine 200 is an example machine upon which any one or more of the techniques and/or methodologies discussed herein may be performed. In alternative aspects of the disclosure, the machine 200 may operate as a standalone device or may be connected (e.g., networked) to other machines. In a networked deployment, the machine 200 may operate in the capacity of a server machine, a client machine, or both in server-client network environments. In an example, the machine 200 may act as a peer machine in peer-to-peer (P2P) (or other distributed) network environment. The machine 200 may be an AP, such as the AP 102 of FIG. 1, a STA, such as one of the STAs 103 of FIG. 1, a UE, an evolved Node B (eNB), a mobile device, a base station, a personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The machine (e.g., computer system) 200 may include a hardware processor 202 (e.g., a central processing unit (CPU), a graphics processing unit (GPU), a hardware processor core, or any combination thereof), a main memory 204 and a static memory 206, some or all of which may communicate with each other via an interlink (e.g., bus) 208. The machine 200 may further include a display unit 210, an alphanumeric input device 212 (e.g., a keyboard), and a user interface (UI) navigation device 214 (e.g., a mouse). In an example, the display unit 210, input device 212 and UI navigation device 214 may be a touch screen display. The machine 200 may additionally include a storage device (e.g., drive unit) 216, a signal generation device 218 (e.g., a speaker), a network interface device 220, and one or more sensors 221, such as a global positioning system (GPS) sensor, compass, accelerometer, or other sensor. The machine 200 may include an output controller 228, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 216 may include a machine readable medium 222 on which is stored one or more sets of data structures or instructions 224 (e.g., software) embodying or utilized by any one or more of the techniques or functions described herein. The instructions 224 may also reside, completely or at least partially, within the main memory 204, within static memory 206, or within the hardware processor 202 during execution thereof by the machine 200. In an example, one or any combination of the hardware processor 202, the main memory 204, the static memory 206, or the storage device 216 may constitute machine readable media. In some aspects of the disclosure, the machine readable medium may be or may include a non-transitory computer-readable storage medium.

While the machine readable medium 222 is illustrated as a single medium, the term "machine readable medium" may include a single medium or multiple media (e.g., a centralized or distributed database, and/or associated caches and servers) configured to store the one or more instructions 224. The term "machine readable medium" may include any medium that is capable of storing, encoding, or carrying instructions for execution by the machine 200 and that cause the machine 200 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal.

The instructions 224 may further be transmitted or received over a communications network 226 using a transmission medium via the network interface device 220 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 220 may include one or more physical jacks (e.g., Ethernet, coaxial, or phone jacks) or one or more antennas to connect to the communications network 226. In an example, the network interface device 220 may include a plurality of antennas to wirelessly communicate using at least one of single-input multiple-output (SIMO), multiple-input multiple-output (MIMO), or multiple-input single-output (MISO) techniques. In some examples, the network interface device 220 may wirelessly communicate using Multiple User MIMO techniques. The term "transmission medium" shall be taken to include any intangible medium that is capable of storing, encoding or carrying instructions for execution by the machine 200, and includes digital or analog communications signals or other intangible medium to facilitate communication of such software.

Figure 3:
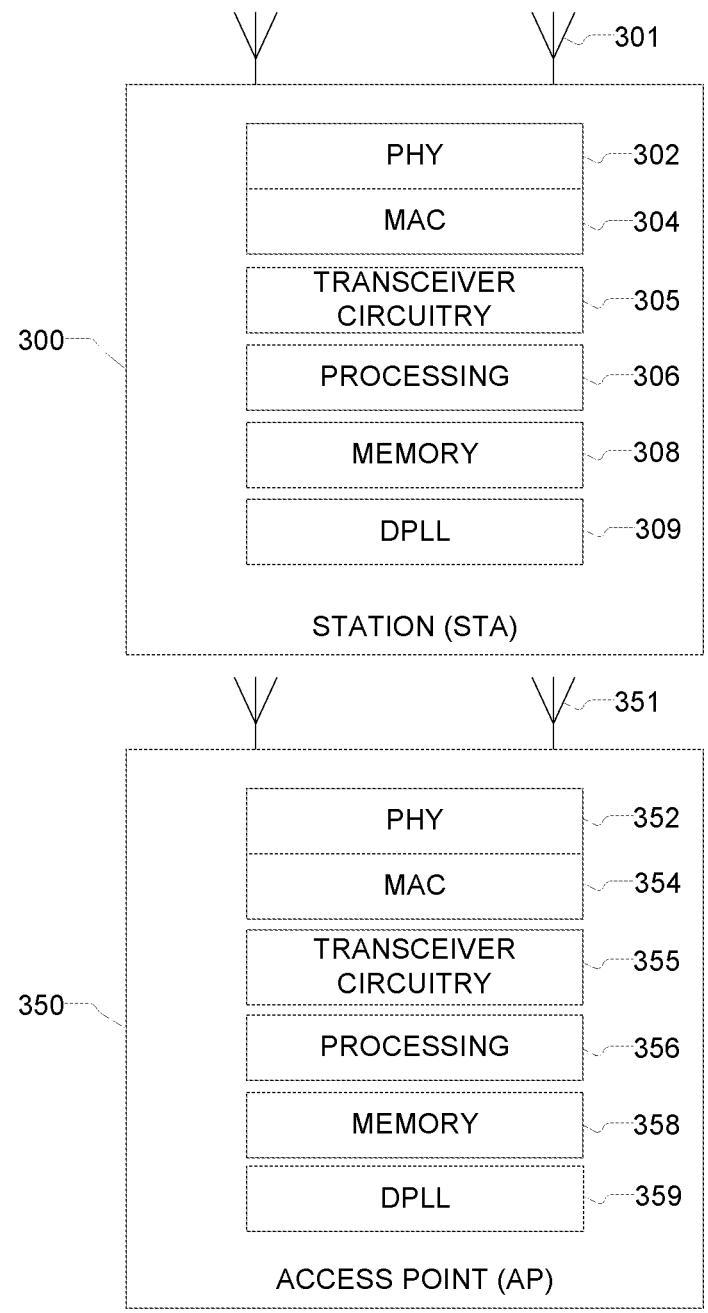
FIG. 3 illustrates a station (STA) in accordance with some aspects of the disclosure and an access point (AP) in accordance with some aspects of the disclosure.

FIG. 3 illustrates a station (STA) in accordance with some aspects of the disclosure and an access point (AP) in accordance with some aspects of the disclosure. It should be noted that in some aspects of the disclosure, an STA or other mobile device may include some or all of the components shown in either FIG. 2 or FIG. 3 (as in 300) or both. The STA 300 may be suitable for use as an STA 103 as depicted in FIG. 1, in some aspects of the disclosure. It should also be noted that in some aspects of the disclosure, an AP or other base station may include some or all of the components shown in either FIG. 2 or FIG. 3 (as in 350) or both. The AP 350 may be suitable for use as an AP 102 as depicted in FIG. 1, in some aspects of the disclosure.

The STA 300 may include physical layer circuitry 302 and a transceiver 305, one or both of which may enable transmission and reception of signals to and from components such as the AP 102 (FIG. 1), other STAs or other devices using one or more antennas 301. As an example, the physical layer circuitry 302 may perform various encoding and decoding functions that may include formation of baseband signals for transmission and decoding of received signals. As another example, the transceiver 305 may perform various transmission and reception functions such as conversion of signals between a baseband range and a Radio Frequency (RF) range. Accordingly, the physical layer circuitry 302 and the transceiver 305 may be separate components or may be part of a combined component. In addition, some of the described functionality related to transmission and reception of signals may be performed by a combination that may include one, any or all of the physical layer circuitry 302, the transceiver 305, and other components or layers. The STA 300 may also include medium access control layer (MAC) circuitry 304 for controlling access to the wireless medium. The STA 300 may also include processing circuitry 306 and memory 308 arranged to perform the operations described herein. The STA 300 may further include a DPLL 309 configured to provide an adjusted voltage controlled oscillator (VCO) or digital-controlled oscillator (DCO) VCO/DCO signal (e.g., an oscillator signal) synchronized to a reference clock signal. The adjusted VCO/DCO signal may be used by one or more of, the physical layer circuitry 302, the MAC circuitry 304, the transceiver 305, the processing circuitry 306, or the memory 308 to perform associated functions having according to proper timing. The DPLL 309 may use a measured phase difference between the reference clock signal and a previously-provided adjusted VCO/DCO signal to provide the adjusted VCO/DCO signal having low phase noise and a corrected phase drift. The DPLL 309 may use a series of cascaded delay elements to provide a quantized digital word equivalent to a time difference between the VCO/DCO signal and the reference clock signal. Because the DPLL 309 is a digital PLL, a quantization error may be produced. The quantization error may be dependent on a delay resolution (e.g., step size) of the delay elements. Due to process variance, the delay elements may not have uniform delay properties, and therefore, resolution may vary among the delay elements. The larger the quantization error, the higher the phase noise in the provided adjusted VCO/DCO signal.

The AP 350 may include physical layer circuitry 352 and a transceiver 355, one or both of which may enable transmission and reception of signals to and from components such as the STA 103 (FIG. 1), other APs or other devices using one or more antennas 351. As an example, the physical layer circuitry 352 may perform various encoding and decoding functions that may include formation of baseband signals for transmission and decoding of received signals. As another example, the transceiver 355 may perform various transmission and reception functions such as conversion of signals between a baseband range and a Radio Frequency (RF) range. Accordingly, the physical layer circuitry 352 and the transceiver 355 may be separate components or may be part of a combined component. In addition, some of the described functionality related to transmission and reception of signals may be performed by a combination that may include one, any or all of the physical layer circuitry 352, the transceiver 355, and other components or layers. The AP 350 may also include medium access control layer (MAC) circuitry 354 for controlling access to the wireless medium. The AP 350 may also include processing circuitry 356 and memory 358 arranged to perform the operations described herein. The AP 350 may further include a DPLL 359 configured to provide an adjusted voltage controlled oscillator (VCO) signal synchronized to a reference clock signal. The adjusted VCO/DCO signal may be used by one or more of, the physical layer circuitry 352, the MAC circuitry 354, the transceiver 355, the processing circuitry 356, or the memory 358 to perform associated functions having according to proper timing. The DPLL 359 may use a measured phase difference between the reference clock signal a previously provided adjusted VCO/DCO signal to provide the adjusted VCO/DCO signal having low phase noise and a corrected phase drift. The DPLL 359 may use a series of cascaded delay elements to provide a quantized digital word equivalent to a time difference between the VCO/DCO signal and the reference clock signal. Because the DPLL 359 is a digital PLL, a quantization error may be produced. The quantization error may be dependent on a delay resolution (e.g., step size) of the delay elements. Due to process variance, the delay elements may not have uniform delay properties, and therefore, resolution may vary among the delay elements. The larger the quantization error, the higher the phase noise in the provided adjusted VCO/DCO signal.

The antennas 301, 351, may comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) aspects of the disclosure, the antennas 301, 351, 230 may be effectively separated to take advantage of spatial diversity and the different channel characteristics that may result.

In some aspects of the disclosure, the STA 300 and/or the AP 350 may be a mobile device and may be a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a wearable device such as a medical device (e.g., a heart rate monitor, a blood pressure monitor, etc.), or other device that may receive and/or transmit information wirelessly. In some aspects of the disclosure, the STA 300 and/or AP 350 may be configured to operate in accordance with 802.11 standards, although the scope of the aspects of the disclosure is not limited in this respect. Mobile devices or other devices in some aspects of the disclosure may be configured to operate according to other protocols or standards, including other IEEE standards, Third Generation Partnership Project (3GPP) standards or other standards. In some aspects of the disclosure, the STA 300 and/or AP 350 may include one or more of a keyboard, a display, a non-volatile memory port, multiple antennas, a graphics processor, an application processor, speakers, and other mobile device elements. The display may be an LCD screen including a touch screen.

Although the STA 300 and the AP 350 are each illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some aspects of the disclosure, the functional elements may refer to one or more processes operating on one or more processing elements.

Aspects of the disclosure may be implemented in one or a combination of hardware, firmware and software. Aspects of the disclosure may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some aspects of the disclosure may include one or more processors and may be configured with instructions stored on a computer-readable storage device.

It should be noted that in some aspects of the disclosure, an apparatus used by the STA 300 may include various components of the STA 300 as shown in FIG. 3 and/or the example machine 200 as shown in FIG. 2. Accordingly, techniques and operations described herein that refer to the STA 300 (or 103) may be applicable to an apparatus for an STA, in some aspects of the disclosure. It should also be noted that in some aspects of the disclosure, an apparatus used by the AP 350 may include various components of the AP 350 as shown in FIG. 3 and/or the example machine 200 as shown in FIG. 2. Accordingly, techniques and operations described herein that refer to the AP 350 (or 102) may be applicable to an apparatus for an AP, in some aspects of the disclosure. In addition, an apparatus for a mobile device and/or base station may include one or more components shown in FIGS. 2-3, in some aspects of the disclosure. Accordingly, techniques and operations described herein that refer to a mobile device and/or base station may be applicable to an apparatus for a mobile device and/or base station, in some aspects of the disclosure.

In some aspects of the disclosure, the STA 300, AP 350, mobile device and/or base station may communicate using SCM signals transmitted over a single carrier communication channel. In some aspects of the disclosure, the STA 300, AP 350, mobile device and/or base station may communicate using OFDM communication signals transmitted over a multicarrier communication channel. Accordingly, in some cases the STA 300, AP 350, mobile device and/or base station may be configured to receive signals in accordance with specific communication standards, such as the Institute of Electrical and Electronics Engineers (IEEE) standards including IEEE 802.11-2012, 802.11n-2009 and/or 802.11ac-2013 standards and/or proposed specifications for WLANs including proposed HEW standards, although the scope of the aspects of the disclosure is not limited in this respect as they may also be suitable to transmit and/or receive communications in accordance with other techniques and standards. In some other aspects of the disclosure, the STA 300, AP 350, mobile device and/or base station may be configured to receive signals that were transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, frequency-division multiplexing (FDM) modulation and/or single carrier frequency-division multiplexing (SC-FDM) although the scope of the aspects of the disclosure is not limited in this respect.

In accordance with some aspects of the disclosure, the STA 300 may determine, based at least partly on a training portion of a received protocol data unit (PDU), operational parameters including a signal quality metric and a carrier frequency offset (CFO) measurement. The STA 300 may decode a data portion of the PDU, the data portion comprising data symbols time-multiplexed with pilot symbols. The STA 300 may compare the signal quality metric to a predetermined signal quality threshold and compare the CFO measurement to a predetermined CFO threshold. If the signal quality metric is greater than or equal to the signal quality threshold and the CFO measurement is less than the CFO threshold, the STA 103 may decode the data portion using phase noise estimates of the pilot symbols. If the signal quality metric is less than the signal quality threshold or the CFO measurement is greater than or equal to the CFO threshold, the STA 103 may refrain from usage of the phase noise estimates of the pilot symbols to decode the data portion. These aspects of the disclosure will be described in more detail below.

Figure 4:
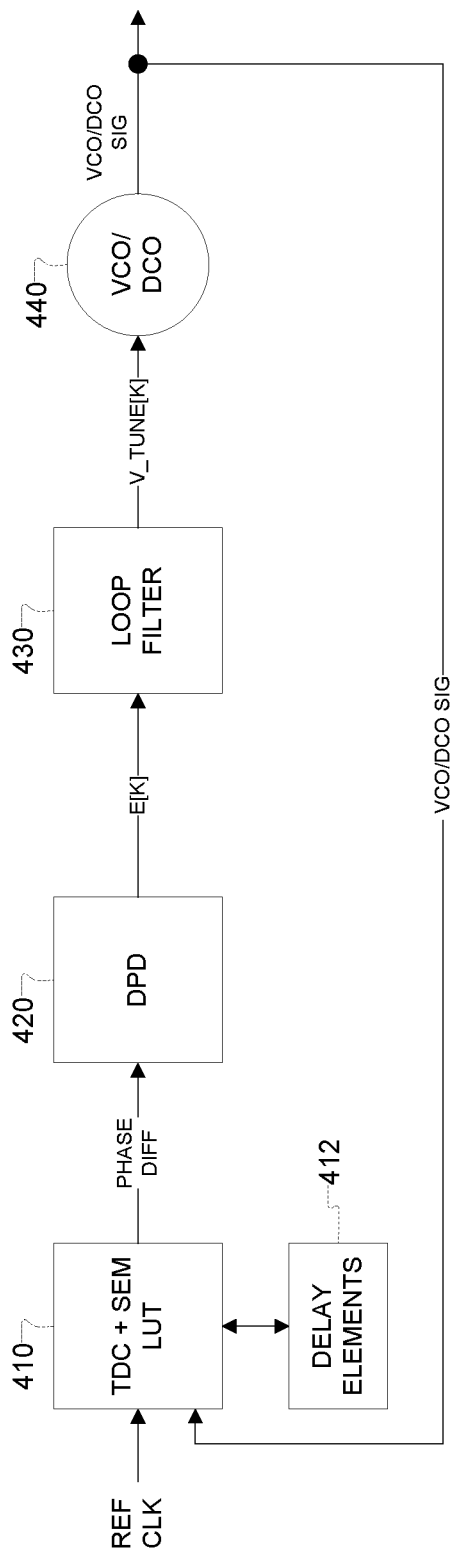
FIG. 4 illustrates a block diagram of an exemplary digital phase-locked loop (DPLL), in accordance with some aspects of the disclosure.

FIG. 4 illustrates a block diagram of an exemplary DPLL 400, in accordance with some aspects of the disclosure of the disclosure. The DPLL 400 may be included in the AP 102 and/or the STAs 103 of FIG. 1, the machine 200 of FIG. 2, the DPLL 309 and/or the DPLL 359 of FIG. 3, or combinations thereof.

The DPLL 400 may include a time-to-digital converter (TDC) and statistical extraction machine (SEM) lookup table (LUT) 410, a digital phase detector (DPD) 420, a loop filter 430, and a voltage-controlled oscillator (VCO) or digital controlled oscillator (DCO) VCO/DCO 440 (e.g., a controlled oscillator). The TDC and SEM LUT 410 may include the TDC to estimate a phase difference between a reference clock and a VCO/DCO signal (e.g., an oscillator signal) using the delay elements 412 and to provide the estimated phase difference value. The delay elements 412 may include a plurality of cascaded delay elements and corresponding one or more flip-flops to sample a signal at various points as it propagates through the plurality of cascaded delay elements. The delay values associated with individual delay elements of the delay elements 412 may vary due to process or temperature and voltage variations, which may result in resolution (e.g., or step size) differences between the individual delay elements of the delay elements 412. The TDC may include a non-linear algorithm to determine the preliminary phase difference value. The SEM LUT of the TDC and SEM LUT 410 may convert the initial phase of the TDC to an estimated phase difference value that considers the non-linear properties of the TDC and the delay elements 412.

The DPD 420 may receive the phase difference value from the SEM LUT 410, and may provide a phase error based on the phase difference value. The phase error may be calculated by calculating an instantaneous frequency based on a change in the estimated phase difference value, comparing the frequency to a desired frequency (e.g., 0 in the case of trying to minimize phase changes) to determine a frequency error, and integrating the frequency error to determine the phase error. The DPD 420 may include integrators and differential circuits to determine the phase error.

The loop filter 430 may receive the phase error and provide a frequency correction command (e.g., V_Tune[k] for a VCO or a DCO word for a DCO). The loop filter 430 may set the frequency correction command to a value that corrects the phase error. Based on the frequency correction command value, the VCO/DCO 440 may provide the VCO/DCO signal. The VCO/DCO signal may be fed back to the TDC and SEM LUT 410 to repeat the process.

In integer operation mode (e.g., a first mode), the DPLL 400 may attempt to provide the VCO/DCO signal having a constant phase relative to the phase of the reference clock signal. Integer operation mode may use an integer ratio to express a phase relationship between the reference clock and the VCO/DCO signal, with no residual. Typically, the phase difference between the reference clock signal and the VCO/DCO signal, once stabilized, may vary within a small phase difference range. Therefore, the DPLL 400 may typically operate among a select few consecutive delay elements of the delay elements 412 to adjust delay and determine a phase difference. That is, delay necessary to make the reference clock signal phase align with the VCO/DCO signal phase may only vary among the select few consecutive delay elements after establishment of an initial delay. As previously discussed, the TDC and SEM LUT 410 may have varied delay properties caused by process variation during fabrication, which may cause some of the delay elements may have step sizes that are smaller than other delay elements. The varied delay properties may result in jitter on the VCO/DCO signal, which may lead to higher phase noise. Accordingly, there may be subsections of the delay elements 412 that provide finer step sizes than other subsections. Operation of the TDC and SEM LUT 410 and the DPD 420 is such an area of the delay elements 412 in which the DPLL 400 operates is based on an initially-set phase difference value. Therefore, in some examples, the DPD 420 may be set up to target these subsections of the delay elements 412 chain that provide the finer step sizes by setting an initial phase difference value that aligns with a subsection of the delay elements 412 having finer step sizes.

For example, the input to the DPD 420 is the phase difference between the reference clock signal and the VCO/DCO signal, denoted by:

$$\varphi_{n\Delta} \triangleq SEM_{OUTPUT}[n]$$

where $\varphi_n$ is the phase difference for the current sample and $SEM_{OUTPUT}[n]$ is the output of the TDC and SEM LUT 410 for the current sample. The DPD 420 may differentiate $\varphi_n$ to determine the instantaneous frequency by applying:

$$f_n^{INST} = \varphi_n - \varphi_{n-1}$$

where $f_n^{INST}$ instantaneous frequency for the current sample, and $\varphi_{n-1}$ is the phase difference for the previous sample. A frequency error may be determined by comparing the instantaneous frequency $f_n^{INST}$ for the current sample to an expected frequency, which in an integer ratio between the VCO/DCO 440 and reference signal is equal to zero to provide the frequency error, as denoted by:

$$f_n^{ERR} = f_n^{INST} - 0 = f_n^{INST} = \varphi_n - \varphi_{n-n}$$

where $f_n^{ERR}$ is the current frequency error. The frequency error may be integrated to provide a phase error, as denoted by:

$$\varphi_n^{ERR} = \varphi_n - \varphi_{n-1} + \varphi_{n-1}^{ERR} = \Sigma_1^1 \varphi_k - \varphi_{k-1} = \varphi_n - \varphi_0$$

where $\varphi_n^{ERR}$ is the current phase error e[k], $\varphi_{n-1}^{ERR}$ is the previous phase error, and $\varphi_0$ is the initial phase error. For the value when n is equal to 1, $\varphi_{n-1}$ may be equal to a reset value of a register, or $\varphi_0$. The DPLL 400 may converge when $\varphi_n^{ERR}$ approximately equal to zero. Thus, the DPD 420 may end up locking $\varphi_n^{ERR}$ on $\varphi_0$ (e.g., $\varphi_n^{ERR} = \varphi_n - \varphi_0 \to 0$ is equivalent to $\varphi_n \to \varphi_0$). Because the DPD 420 ends up locking on the initial phase difference value $\varphi_0$, the DPLL 400 may be set up to initialize the initial phase difference value to target the subsection of the delay elements 412 having finer resolution (e.g., $\varphi_0 := \varphi_{DESIRED}$), rather than defaulting to zero or some other arbitrary value.

To determine the subsection of the cascaded delay element chain, in a first (e.g., initialization) mode, the DPLL 400 may step through each delay element of the delay elements 412 to determine individual step sizes (e.g., or delay values). The DPLL 400 may then identify which subsection or group of consecutive delay elements of the delay elements 412 offers a finest resolution. The group may be a set of delay elements, in some examples. The group may be selected based on an average delay value or step size among the group (e.g., having a smallest delay value or average as compared with other groups of delay elements of the delay elements 412), or based on an aggregate delay value (e.g., e.g., having a smallest total delay value as compared with other same sized groups of delay elements of the delay elements 412) or any other metric. The DPLL 400 may set a desired phase difference value $\varphi_{DESIRED}$ that aligns with the identified subsection or group, and may set the initial phase difference value $\varphi_0$ to the desired phase difference value $\varphi_{DESIRED}$. The desired phase difference value $\varphi_{DESIRED}$ may be set to a phase difference value that aligns with a median phase difference value associated with the group of delay elements of the delay elements 412, in some examples.

In a second (e.g., normal operation) mode, the DPLL 400 may adjust the phase of the VCO/DCO signal to align with the phase of the reference clock signal, using the $\varphi_{DESIRED}$ as an initial phase difference value. Because the initial phase difference value $\varphi_{DESIRED}$ targets a subset or group of delay elements having a finest resolution, the DPLL 400 may operate in a delay range within or adjacent to the subset or group of delay elements having a finest resolution, which may reduce jitter and phase noise on the VCO/DCO signal from the DPLL 400, as compared with operating using delay elements having more coarse resolution.

Figure 5:
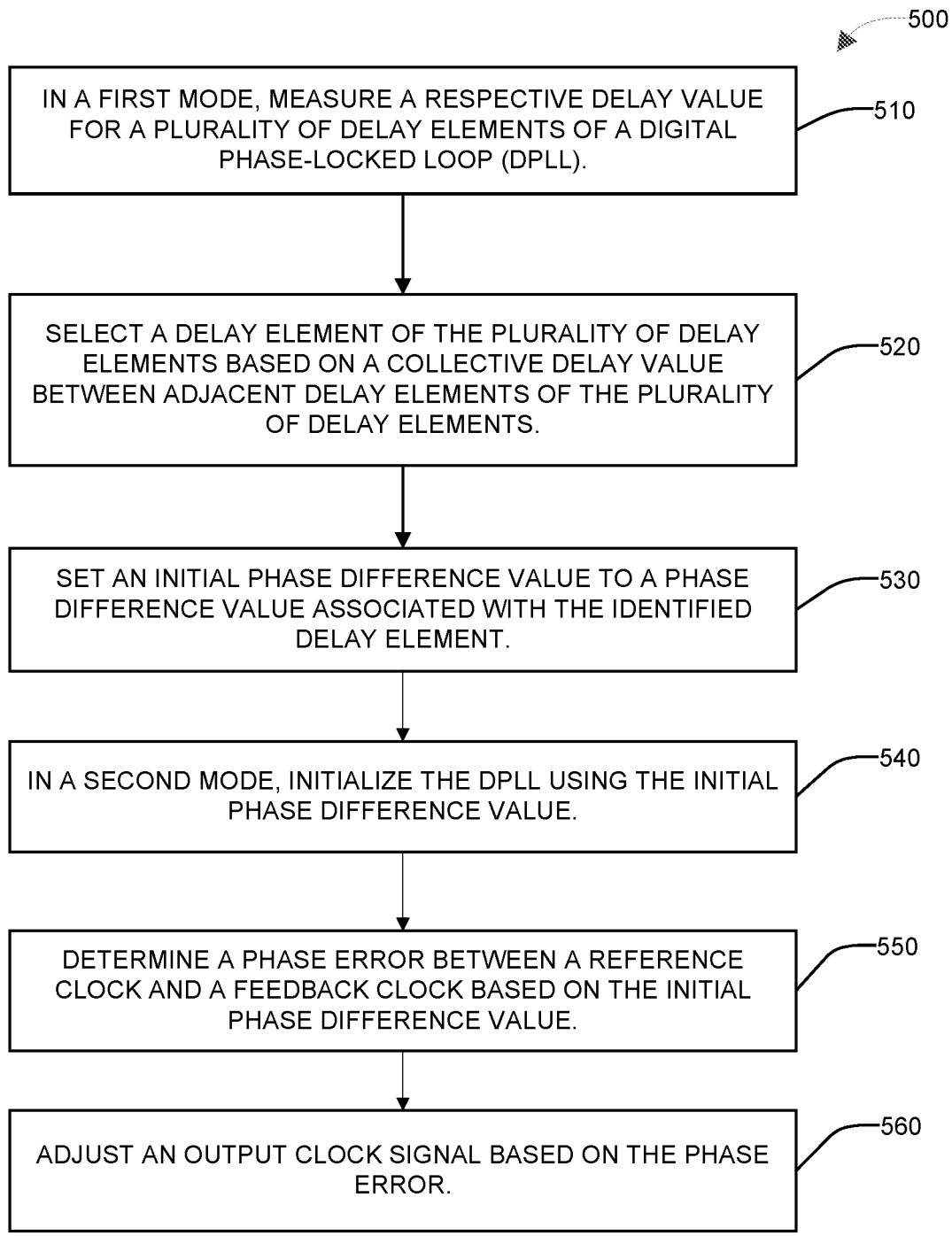
FIG. 5 illustrates a flowchart for a method to phase-adjust an output clock in accordance with some aspects of the disclosure.

FIG. 5 illustrates a flowchart for a method to phase-adjust an output clock in accordance with some aspects of the disclosure. It is important to note that aspects of the disclosure of the method 500 may include additional or even fewer operations or processes in comparison to what is illustrated in FIG. 5. In addition, aspects of the disclosure of the method 500 are not necessarily limited to the chronological order that is shown in FIG. 5. In describing the method 500, reference may be made to FIGS. 1-4, although it is understood that the method 500 may be practiced with any other suitable systems, interfaces and components.

In addition, the method 500 and other methods described herein may refer to STAs 103 and/or AP 102 of FIG. 1, or STA 300 and/or AP 350 of FIG. 3, operating in accordance with one or more standards and/or protocols, such as 802.11, Wi-Fi, wireless local area network (W-LAN) and/or other, but aspects of the disclosure of those methods are not limited to just those devices. In some aspects of the disclosure, the method 500 and other methods described herein may be practiced by other mobile devices, such as an HEW STA, an HEW AP, an Evolved Node-B (eNB) or User Equipment (UE). The method 500 and other methods described herein may also be practiced by wireless devices configured to operate in other suitable types of wireless communication systems, including systems configured to operate according to various Third Generation Partnership Project (3GPP) Long Term Evolution (LTE) standards. The method 500 may also be applicable to an apparatus for an STA 103/300 and/or AP 102/350 or other device described above, in some aspects of the disclosure.

The method 500 may include, in a first mode, measuring a respective delay value for a plurality of delay elements of a digital phase-locked loop (DPLL), at 510. The DPLL may include the DPLL 309 or the DPLL 359 of FIG. 3 or the 400 of FIG. 4. The plurality of delay elements may include serially-coupled inverter circuits, in some examples. The plurality of delay elements may be implemented in the delay elements 412 of FIG. 4. Measurement of the respective delay values may be implemented in the TDC and SEM LUT 410 of FIG. 4. In the first mode, the method 500 may further include selecting a delay element of the plurality of delay elements based on a collective delay value between adjacent delay elements of the plurality of delay elements, at 520. In some examples, selection of the delay element may include selecting the delay element of the plurality of delay elements having a lowest collective delay value between adjacent delay elements of the plurality of delay elements. In the first mode, the method 500 may further include setting an initial phase difference value to a phase difference value associated with the selected delay element, at 530.

In a second mode, the method 500 may include initializing the DPLL using the initial phase difference value, at 540. In the second mode, the method 500 may further include determining a phase error between a reference clock and a feedback clock based on the initial phase difference value, at 550. The method 500 may further include comparing a phase of the reference clock phase to a phase of the feedback clock to provide a delay value using the plurality of delay elements, and looking up a phase estimation value based on the delay value, wherein the phase error is based on the phase estimation value. The comparing and looking up may be performed by the TDC and SEM LUT 410 of FIG. 4. The method may further include determining a phase error based on a changes in the phase estimation value, such as by the DPD of FIG. 4. Determining the phase error may include calculating an instantaneous frequency based on a change in the estimated phase difference value, comparing the frequency to a desired frequency to determine a frequency error, and integrating the frequency error to determine the phase error. The method 500 may further include providing a frequency correction value based on the phase error, and providing the output clock signal based on the frequency correction value, such as via the loop filter 430. The phase difference may be determined by the DPLL. In the second mode, the method 500 may further include adjusting an output clock signal based on the phase difference, at 560.

ADDITIONAL NOTES & EXAMPLES

Example 1 is an apparatus of a wireless device, the apparatus comprising: processing circuitry, configured to: in a first mode: measure a respective delay value for a plurality of delay elements of a digital phase-locked loop (DPLL); select a delay element of the plurality of delay elements based on a collective delay value between adjacent delay elements of the plurality of delay elements; and set an initial phase difference value to a phase difference value associated with the selected delay element; and in a second mode: initialize the DPLL using the initial phase difference value; and determine a phase error between a reference clock and a feedback clock based on the initial phase difference value; and adjust an output clock signal based on the phase error.

In Example 2, the subject matter of Example 1 optionally includes wherein the plurality of delay elements are serially-coupled delay elements.

In Example 3, the subject matter of Example 2 optionally includes wherein the plurality of delay elements includes serially-coupled inverter circuits.

In Example 4, the subject matter of any one or more of Examples 1-3 optionally include wherein the DPLL includes: a time-to-digital converter (TDC) to compare a phase of the reference clock to a phase of the feedback clock to provide a delay value using the plurality of delay elements; and a lookup table to determine a phase estimation value based on the delay value.

In Example 5, the subject matter of Example 4 optionally includes wherein the DPLL further includes a digital phase detector (DPD) to determine the phase error based on a change in the phase estimation value.

In Example 6, the subject matter of Example 5 optionally includes wherein the processing circuitry is configured to cause the DPD to: calculate an instantaneous frequency based on a change in the estimated phase difference value; compare the frequency to a desired frequency to determine a frequency error; and integrate the frequency error to determine the phase error.

In Example 7, the subject matter of any one or more of Examples 5-6 optionally include wherein the DPLL further includes: a loop filter to provide a frequency correction command based on the phase error; and a controlled oscillator to provide the output clock signal based on the frequency correction command.

In Example 8, the subject matter of Example 7 optionally includes wherein the controlled oscillator includes one of a voltage-controlled oscillator or a digital-controlled oscillator.

In Example 9, the subject matter of any one or more of Examples 1-8 optionally include transceiver circuitry to receive data in response to the output clock signal.

In Example 10, the subject matter of any one or more of Examples 1-9 optionally include wherein selection of the delay element of the plurality of delay elements based on the associated delay value includes the processing circuitry to select the delay element having a lowest delay value.

Example 11 is an apparatus of an access point, the apparatus comprising: processing circuitry, configured to: in a first mode: identify a delay element of a plurality of delay elements based on an associated delay value; and set an initial phase difference value to a phase difference value associated with the identified delay element; and in a second mode: initialize a digital phase-locked loop (DPLL) using the initial phase difference value; and determine a phase error between a reference clock and a feedback clock based on the initial phase difference value; and adjust an output clock signal based on the phase error.

In Example 12, the subject matter of Example 11 optionally includes wherein the plurality of delay elements include inverter circuits.

In Example 13, the subject matter of any one or more of Examples 11-12 optionally include wherein the DPLL includes: a time-to-digital converter (TDC) to determine a delay value based on relative timing of the reference clock and the feedback clock using the plurality of delay elements; and a lookup table to determine a phase estimation based on the delay value.

In Example 14, the subject matter of Example 13 optionally includes wherein the DPLL further includes a digital phase detector (DPD) to determine a phase error based on a change in the phase estimation.

In Example 15, the subject matter of Example 14 optionally includes wherein the DPLL further includes: a loop filter to provide a frequency correction value based on the phase error; and a controlled oscillator to provide the output clock signal.

In Example 16, the subject matter of any one or more of Examples 11-15 optionally include a physical layer to receive data in response to the output clock signal.

In Example 17, the subject matter of any one or more of Examples 11-16 optionally include wherein identification of the delay element of the plurality of delay elements based on the associated delay value includes the processing circuitry to identify the delay element having a lowest delay value.

Example 18 is a non-transitory computer-readable storage medium that stores instructions for execution by processing circuitry of a wireless device causing the wireless device to: in a first mode: measure a respective delay value for a plurality of delay elements of a digital phase-locked loop (DPLL); select a delay element of the plurality based on a collective delay value between adjacent delay elements of the plurality; and set an initial phase difference value to a phase difference value associated with the selected delay element; and in a second mode: initialize the DPLL using the initial phase difference value; and determine a phase error between a reference clock and a feedback clock based on the initial phase difference value; and adjust an output clock signal based on the phase error.

In Example 19, the subject matter of Example 18 optionally includes wherein the plurality of delay elements are serially-coupled delay elements.

In Example 20, the subject matter of Example 19 optionally includes wherein the plurality of delay elements includes serially-coupled inverter circuits.

In Example 21, the subject matter of any one or more of Examples 18-20 optionally include wherein the instructions further cause the wireless device to: compare a phase of the reference clock phase to a phase of the feedback clock to provide a delay value using the plurality of delay elements; and look up a phase estimation value based on the delay value, wherein the phase error is based on the phase estimation value.

In Example 22, the subject matter of any one or more of Examples 18-21 optionally include wherein the instructions further cause the wireless device to determine a phase error based on a changes in the phase estimation value.

In Example 23, the subject matter of Example 22 optionally includes wherein the instructions that cause the wireless device to determine the phase error based on changes in the phase estimation value includes instructions that cause the wireless device to: calculating an instantaneous frequency based on a change in the estimated phase difference value; comparing the frequency to a desired frequency to determine a frequency error; and integrating the frequency error to determine the phase error.

In Example 24, the subject matter of any one or more of Examples 22-23 optionally include wherein the instructions further cause the wireless device to: provide a frequency correction value based on the phase error; and provide the output clock signal based on the frequency correction value.

In Example 25, the subject matter of any one or more of Examples 18-24 optionally include wherein the instructions that cause the wireless device to select the delay element of the plurality of delay elements based on the associated delay value comprise instructions that cause the wireless device to select the delay element having a lowest delay value.

Example 26 is a method to initialize a digital phase lock loop of a wireless device, the method comprising: in a first mode: measuring a respective delay value for a plurality of delay elements of a digital phase-locked loop (DPLL); selecting a delay element of the plurality o based on a collective delay value between adjacent delay elements of the plurality; and setting an initial phase difference value to a phase difference value associated with the selected delay element; and in a second mode: initializing the DPLL using the initial phase difference value; and determining a phase error between a reference clock and a feedback clock based on the initial phase difference value; and adjusting an output clock signal based on the phase error.

In Example 27, the subject matter of Example 26 optionally includes wherein the plurality of delay elements are serially-coupled delay elements.

In Example 28, the subject matter of Example 27 optionally includes wherein the plurality of delay elements includes serially-coupled inverter circuits.

In Example 29, the subject matter of any one or more of Examples 26-28 optionally include comparing a phase of the reference clock phase to a phase of the feedback clock to provide a delay value using the plurality of delay elements; and looking up a phase estimation value based on the delay value, wherein the phase error is based on the phase estimation value.

In Example 30, the subject matter of any one or more of Examples 26-29 optionally include determining a phase error based on a changes in the phase estimation value.

In Example 31, the subject matter of Example 30 optionally includes wherein determining the phase error based on changes in the phase estimation value comprises: calculating an instantaneous frequency based on a change in the estimated phase difference value; comparing the frequency to a desired frequency to determine a frequency error; and integrating the frequency error to determine the phase error.

In Example 32, the subject matter of any one or more of Examples 30-31 optionally include providing a frequency correction value based on the phase error; and providing the output clock signal based on the frequency correction value.

In Example 33, the subject matter of any one or more of Examples 26-32 optionally include wherein selecting the delay element of the plurality of delay elements based on the associated delay value comprises selecting the delay element having a lowest delay value.

Example 34 is a non-transitory computer-readable storage medium that stores instructions for execution by processing circuitry causing the processing circuitry to perform any method of Examples 26-33.

Example 35 is an apparatus comprising means to perform any method of Examples 26-33.

Example 36 is an apparatus to initialize a digital phase lock loop of a wireless device, the apparatus comprising: in a first mode: means for measuring a respective delay value for a plurality of delay elements of a digital phase-locked loop (DPLL); means for selecting a delay element of the plurality based on a collective delay value between adjacent delay elements of the plurality of delay elements; and means for setting an initial phase difference value to a phase difference value associated with the selected delay element; and in a second mode: means for initializing the DPLL using the initial phase difference value; and means for determining a phase error between a reference clock and a feedback clock based on the initial phase difference value; and means for adjusting an output clock signal based on the phase error.

In Example 37, the subject matter of Example 36 optionally includes wherein the plurality of delay elements are serially-coupled delay elements.

In Example 38, the subject matter of Example 37 optionally includes wherein the plurality of delay elements includes serially-coupled inverter circuits.

In Example 39, the subject matter of any one or more of Examples 36-38 optionally include means for comparing a phase of the reference clock phase to a phase of the feedback clock to provide a delay value using the plurality of delay elements; and means for looking up a phase estimation value based on the delay value, wherein the phase error is based on the phase estimation value.

In Example 40, the subject matter of any one or more of Examples 36-39 optionally include means for determining a phase error based on a changes in the phase estimation value.

In Example 41, the subject matter of Example 40 optionally includes wherein determining the phase error based on changes in the phase estimation value comprises: means for calculating an instantaneous frequency based on a change in the estimated phase difference value; means for comparing the frequency to a desired frequency to determine a frequency error; and means for integrating the frequency error to determine the phase error.

In Example 42, the subject matter of any one or more of Examples 40-41 optionally include wherein the DPLL further includes: means for providing a frequency correction value based on the phase error; and means for providing the output clock signal based on the frequency correction value.

In Example 43, the subject matter of any one or more of Examples 36-42 optionally include wherein selecting the delay element of the plurality of delay elements based on the associated delay value comprises means for selecting the delay element having a lowest delay value.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus of a wireless device, the apparatus comprising:
    one or more processors, configured to:
        in a first mode:
            measure a respective delay value for a plurality of delay elements of a digital phase-locked loop (DPLL);
            select a delay element of the plurality of delay elements based on a collective delay value between adjacent delay elements of the plurality of delay elements; and
            set an initial phase difference value to a phase difference value associated with the selected delay element; and
        in a second mode:
            initialize the DPLL using the initial phase difference value; and
            determine a phase error between a reference clock and a feedback clock based on the initial phase difference value; and
            adjust an output clock signal based on the phase error.

2. The apparatus according to claim 1, wherein the plurality of delay elements are serially-coupled delay elements.

3. The apparatus according to claim 2, wherein the plurality of delay elements includes serially-coupled inverter circuits.

4. The apparatus according to claim 1, wherein the DPLL includes:
    a time-to-digital converter (TDC) to compare a phase of the reference clock to a phase of the feedback clock to provide a delay value using the plurality of delay elements; and
    a lookup table to determine a phase estimation value based on the delay value.

5. The apparatus according to claim 4, wherein the DPLL further includes a digital phase detector (DPD) to determine a phase error based on a change in the phase estimation value.

6. The apparatus according to claim 5, wherein the one or more processors are configured to cause the DPD to:
    calculate an instantaneous frequency based on the change in the estimated phase difference value;
    compare the instantaneous frequency to a desired frequency to determine a frequency error; and
    integrate the frequency error to determine the phase error.

7. The apparatus according to claim 5, wherein the DPLL further includes:
    a loop filter to provide a frequency correction command based on the phase error; and
    a controlled oscillator to provide the output clock signal based on the frequency correction command.

8. The apparatus according to claim 7, wherein the controlled oscillator includes one of a voltage-controlled oscillator or a digital-controlled oscillator.

9. The apparatus according to claim 1, further comprising transceiver circuitry to receive data in response to the output clock signal.

10. The apparatus according to claim 1, wherein selection of the delay element of the plurality of delay elements based on the associated delay value includes selecting the delay element having a lowest delay value.

11. An apparatus of an access point, the apparatus comprising:
    one or more processors, configured to:
        in a first mode:
            identify a delay element of a plurality of delay elements based on an associated delay value; and
            set an initial phase difference value to a phase difference value associated with the identified delay element; and
        in a second mode:
            initialize a digital phase-locked loop (DPLL) using the initial phase difference value; and
            determine a phase error between a reference clock and a feedback clock based on the initial phase difference value; and
            adjust an output clock signal based on the phase error.

12. The apparatus according to claim 11, wherein the plurality of delay elements includes inverter circuits.

13. The apparatus according to claim 11, wherein the DPLL includes:
    a time-to-digital converter (TDC) to determine a delay value based on relative timing of the reference clock and the feedback clock using the plurality of delay elements; and
    a lookup table to determine a phase estimation based on the delay value.

14. The apparatus according to claim 13, wherein the DPLL further includes a digital phase detector (DPD) to determine a phase error based on a change in the phase estimation.

15. The apparatus according to claim 14, wherein the DPLL further includes:
    a loop filter to provide a frequency correction value based on the phase error; and
    a controlled oscillator to provide the output clock signal.

16. The apparatus according to claim 11, further comprising a physical layer to receive data in response to the output clock signal.

17. The apparatus according to claim 11, wherein identification of the delay element of the plurality of delay elements based on the associated delay value includes identifying the delay element having a lowest delay value.

18. A non-transitory computer-readable storage medium that stores instructions for execution by one or more processors to initialize a digital phase lock loop of a wireless device by:
    in a first mode:
        measuring a respective delay value for a plurality of delay elements of a digital phase-locked loop (DPLL);

selecting a delay element of the plurality of delay elements based on a collective delay value between adjacent delay elements of the plurality of delay elements; and setting an initial phase difference value to a phase difference value associated with the selected delay element; and in a second mode:

initializing the DPLL using the initial phase difference value;

determining a phase error between a reference clock and a feedback clock based on the initial phase difference value; and adjusting an output clock signal based on the phase error.

19. The medium according to claim 18, wherein the plurality of delay elements are serially-coupled delay elements.

20. The medium according to claim 18, wherein the instructions are further executable to:

compare a phase of the reference clock to a phase of the feedback clock to provide a delay value using the plurality of delay elements; and look up a phase estimation value based on the delay value, wherein the phase error is based on the phase estimation value.

21. The medium according to claim 18, wherein the instructions further cause the one or more processors to determine a phase error based on a change in the phase estimation value.

22. The medium according to claim 21, wherein determining the phase error based on changes in the phase estimation value comprises:

calculating an instantaneous frequency based on a change in the estimated phase difference value;

comparing the instantaneous frequency to a desired frequency to determine a frequency error; and integrating the frequency error to determine the phase error.

23. The medium according to claim 21, wherein the instructions are further executable to:

provide a frequency correction value based on the phase error; and provide the output clock signal based on the frequency correction value.

24. The medium according to claim 18, wherein the instructions are further executable to select the delay element of the plurality of delay elements based on the associated delay value by selecting the delay element having a lowest delay value.

* * * * *